(12) United States Patent
Madhavan et al.

(10) Patent No.: US 7,675,452 B2
(45) Date of Patent: Mar. 9, 2010

(54) SUCCESSIVE APPROXIMATION REGISTER ANALOG TO DIGITAL CONVERTER WITH IMPROVED IMMUNITY TO TIME VARYING NOISE

(75) Inventors: Mahesh K Madhavan, Kerala (IN); Srikanth Aruna Nittala, East Godavari Dt. (IN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/113,307

(22) Filed: May 1, 2008

(65) Prior Publication Data

US 2009/0273501 A1    Nov. 5, 2009

(51) Int. Cl.
    *H03M 1/34* (2006.01)
(52) U.S. Cl. .................. 341/162; 341/155; 341/172
(58) Field of Classification Search .................. 341/155, 341/162, 120, 172
    See application file for complete search history.

(56) References Cited

U.S. PATENT DOCUMENTS

| 6,587,066 | B1 * | 7/2003 | Somayajula | 341/172 |
| 6,707,403 | B1 * | 3/2004 | Hurrell | 341/120 |
| 6,850,181 | B1 | 2/2005 | Tsinker | |
| 6,950,052 | B2 | 9/2005 | Leung | |
| 7,015,841 | B2 * | 3/2006 | Yoshida et al. | 341/120 |
| 7,190,300 | B2 * | 3/2007 | Confalonieri et al. | 341/172 |
| 2004/0075601 | A1 | 4/2004 | Carreau et al. | |
| 2004/0233093 | A1 | 11/2004 | Confalonieri et al. | |

FOREIGN PATENT DOCUMENTS

| EP | 1018806 A2 | 7/2000 |
| EP | 1039642 A1 | 9/2000 |

OTHER PUBLICATIONS

Wei-Shang Chu and K. Wayne Current, "A Rail-to-Rail Input-Range CMOS Voltage Comparator", pp. 160-163, IEEE Transactions on CAS, 1997.
Nov. 11, 2009 International Search Report for PCT/US09/41871.

* cited by examiner

*Primary Examiner*—Jean B Jeanglaude
(74) *Attorney, Agent, or Firm*—Kenyon & Kenyon LLP (57) ABSTRACT

An SAR ADC provides increased immunity to noise introduced by time varying noise components provided on reference potentials ($V_{REF}$). Reference voltage noise contributions are canceled by introducing a reference voltage component to a pair of binary weighted capacitor arrays (NDAC and PDAC) during bit trials, which are presented to a differential comparator as a common mode signal and rejected. During sampling, select elements in either the PDAC or the NDAC also obtain a reference voltage contribution. Although the sampled $V_{REF}$ signal may have a noise contribution, the noise is fixed at the time of bit trials, which can improve performance. Generally, the scheme provides a 50% reduction in noise errors over the prior art for the same $V_{REF}$ noise. Additional embodiments described herein can reduce noise errors to 25% or even 12.5% over prior art systems.

20 Claims, 6 Drawing Sheets

FIG. 1(a)
Prior Art Sampling

FIG. 1(b)
Prior Art Bit Test

FIG. 2(a)
200
Sampling

FIG. 2(b)
200
Bit Trial

FIG. 3(a)
300
Sampling

FIG. 3(b)
300
Bit Trial

SUCCESSIVE APPROXIMATION REGISTER ANALOG TO DIGITAL CONVERTER WITH IMPROVED IMMUNITY TO TIME VARYING NOISE

BACKGROUND

The present invention relates to an improved successive approximation register analog to digital converter (SAR ADC) and particularly, to an SAR ADC having increase immunity to time variant noise signals on its reference voltage sources.

SAR ADCs are well known devices. Generally, they generate a digital code representing the magnitude of an input voltage ($V_{IN}$). SAR ADCs operate in two phases—a sampling phase and a bit trial phase. During the sampling phase, the input voltage is acquired. During the bit trial phase, the input voltage is compared against test voltages to determine whether the input voltage is greater than or less than the respective test voltages. SAR ADCs operate bit by bit, comparing the input voltage initially to an analog voltage value corresponding to the most significant bit (MSB), deciding upon the value of the MSB and thereafter comparing the input voltage to an analog voltage value representing a combination of the selected MSB and a candidate value for the next lower bit position. The bit trial process operates incrementally across all bit positions from the MSB to the least significant bit (LSB) position until a complete digital code is generated that corresponds to the input voltage.

SAR ADCs, however, suffer from noise effects that may be present in source voltages that are used by the circuit. Often, the SAR ADC uses a voltage source $V_{REF}$ representing the highest voltage that the input voltage can take. The SAR ADC may use another reference voltage $V_{REF}$ that is maintained either at $V_{DD}$ or at some intermediate potential. In modern circuit systems, both of the voltage sources can include time-varying noise components that can introduce error to the conversion process.

Figure 1A:
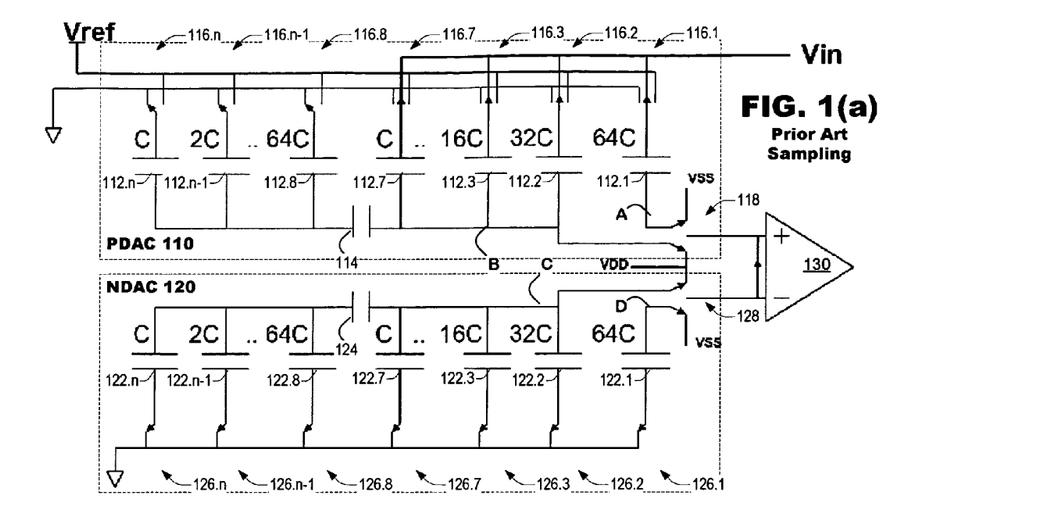
FIGS. 1(a) and 1(b) illustrate an SAR ADC as is known in the art.
Figure 1B:
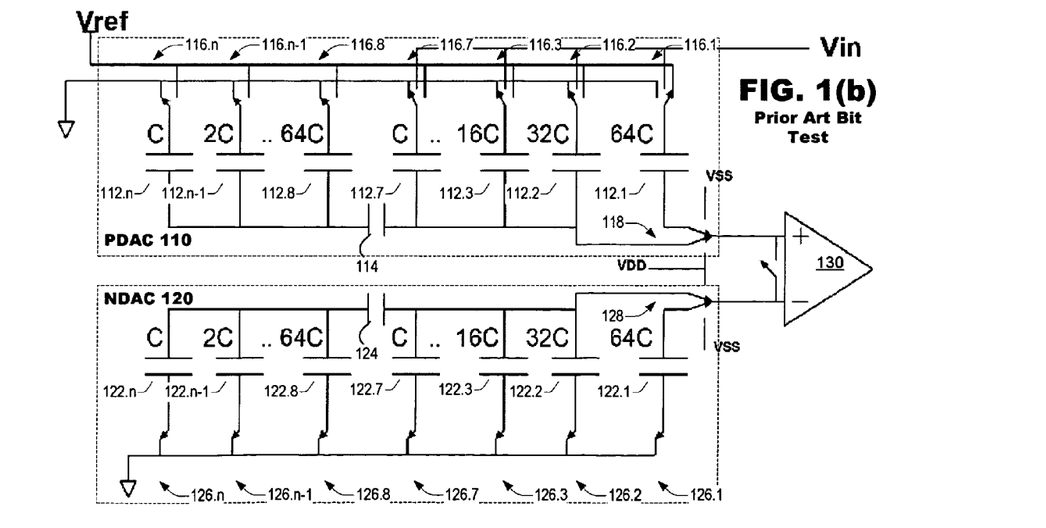

FIGS. 1(a) and 1(b) illustrate a SAR ADC 100 that suffers from such noise effects. Here, the ADC 100 includes two arrays of capacitors 110, 120, called "PDAC" and "NDAC" respectively, that are coupled to positive and negative inputs of a differential comparator 130. The PDAC 110 includes an array of binary weighted capacitors 112.1-112.n and a coupling capacitor 114. The coupling capacitor 114 divides the PDAC 110 into two spans 114.1 and 114.2. Bottom plates of each capacitor 112.1-112.n in the first span 114.1 are coupled to switches 116.1-116.7 which can be selectively controlled to couple the bottom plates respectively to $V_{IN}$, $V_{REF}$ or ground by a control signal (not shown). Bottom plates of remaining capacitors are selectively connected by switches 116.8-116.n to $V_{REF}$ and ground. Top plates of all capacitors 112.1-112.7 in the main DAC span 114.1 and the coupling capacitor 114 are coupled to switches (shown collectively as 118), which permit the capacitors to be selectively coupled to $V_{DD}$, $V_{SS}$ (ground) and the positive terminal of the differential comparator 130. Top plates of the remaining capacitors 112.8-112.n are coupled to the coupling capacitor 114.

The NDAC 120 also includes an array of binary weighted capacitors 122.1-122.n and a coupling capacitor 124. Bottom plates of each capacitor 122.1-122.n are coupled to switches 126.1-126.n which selectively couple the bottom plates to $V_{REF}$ or ground by a control signal (not shown). Top plates of all capacitors 122.1-122.7 of a main DAC span 124.1 and the coupling capacitor 124 are coupled to switches (shown collectively as 128), which permit the capacitors to be selectively coupled to $V_{DD}$, $V_{SS}$ and the negative terminal of the differential comparator 130. Top plates of the remaining capacitors 122.8-122.n may be coupled to the coupling capacitor 124.

FIG. 1(a) illustrates a switching configuration of the SAR ADC 100 during a sampling phase. Within the PDAC 110, bottom plates of all capacitors within the main DAC span 114.1 are connected to the input voltage $V_{IN}$. The top plate of the MSB capacitor 112.1 is connected to $V_{SS}$. Top plates of all other capacitors in the main DAC span 114.1 are connected to $V_{DD}$. Top plates of the capacitors 112.8-112.n in the sub DAC span 114.2 are connected to ground. Within the NDAC, bottom plates of all capacitors 121.1-121.n and 124 are connected to $V_{SS}$. A top plate of capacitor 122.1 is connected to $V_{SS}$ and top plates of the other capacitors 122.2-122.7 are connected to $V_{DD}$. The switch configurations generate four independent nodes, labeled A-D in FIG. 1(a), which carry charges as follows:

TABLE 1

| NODE | CHARGE |
|---|---|
| A | $Q_A = -V_{IN} * 64C$ |
| B | $Q_B = (V_{DD} - V_{IN}) * (64 + k) * C$ |
| C | $Q_C = 0$ |
| D | $Q_D = V_{DD}(64 + k)C$ | where C represents a capacitance value of a base capacitor 112.n and k represents an aggregate capacitance of the coupling capacitor 114 and the capacitors 112.8-112.n of the sub DAC span 114.2 of the PDAC 110 (or, equivalently, those capacitors of the NDAC).

FIG. 1(b) illustrates a switching configuration of the SAR ADC 100 during a bit trial phase when the MSB position is subject to test. Within the PDAC 110, switches 118 connect nodes A and B to the positive input terminal of the differential comparator 130. Switch 116.1 connects the bottom plate of the MSB capacitor 112.1 to a $V_{REF}$ input and the switches 116.2-116.n connect the bottom plates of the remaining capacitors 112.2-112.n to ground. Within the NDAC 120, switches 128 connect nodes C and D both to the negative input terminal of the differential comparator 130. Switches 126.1-126.n connect all capacitors to ground. The switch configurations generate charges at the input terminals of the differential comparator 130 as follows:

TABLE 2

| NODE | CHARGE |
|---|---|
| Positive Input Terminal | $Q = (V_{pos} - V_{REF}) 64C + (V_{pos}) * (64 + k)C$ |
| Negative Input Terminal | $Q_{neg} = (V_{neg} - 0)(128 + k)C$ |

Because the charges at the comparator's input terminals are the same as the summation of charges respectively on the node pairs A|B and C|D, the voltages at the positive and negative input terminals ($V_{POS}$ & $V_{NEG}$) can be computed as follows:

$$V_{pos} = \frac{128}{128+k}\left[\frac{V_{DD}(64+k)}{128} + \frac{V_{REF}}{2} - V_{in}\right]$$

$$V_{neg} = \frac{128}{128+k}\left[\frac{V_{DD}(64+k)}{128}\right]$$

The voltages at the positive input node has a $V_{REF}$ component, which because $V_{REF}$ is connected during the bit trial phase, can introduce a portion of time varying noise present on $V_{REF}$ to the positive input of the comparator. This noise component of the $V_{REF}$ signal can contributes to ADC conversion error.

Accordingly, there is a need in the art for an improved SAR ADC that provides improved immunity to noise signals present on the voltage sources on which the SAR ADC operates.

DETAILED DESCRIPTION

The present invention cancels noise contributions provided by $V_{REF}$ by introducing a $V_{REF}$ component to the NDAC during bit trials. $V_{REF}$ components, therefore, appear on both inputs of the differential comparator and will be rejected by the comparator as a common mode signal. Specifically, during bit trials, NDAC capacitors are connected to a $V_{REF}$ source in a manner that mimics the first bit trial switch settings of PDAC. In this manner, any time-varying noise contribution from the $V_{REF}$ source will be rejected by the comparator as a common mode voltage. During sampling, select elements in either the PDAC or the NDAC also obtain a $V_{REF}$ contribution. Although the sampled $V_{REF}$ signal may have a noise contribution, the noise is fixed at the time of bit trials, which do not cause differential non-linearity errors in the ADC. Generally, the scheme provides a 50% reduction in noise errors over the prior art for the same $V_{REF}$ noise. Additional embodiments described herein can reduce noise errors to 25% or even 12.5% over prior art systems.

Figure 2A:
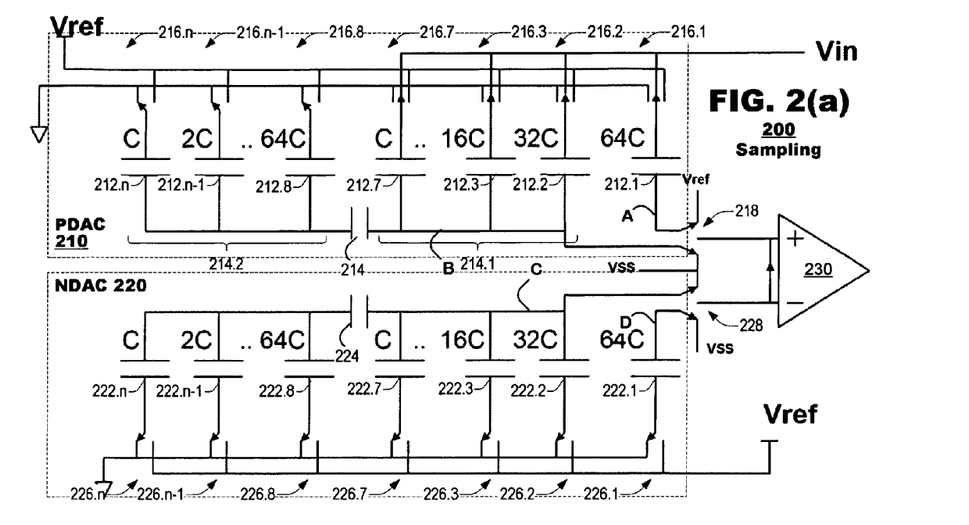
FIGS. 2(a) and 2(b) illustrate an SAR ADC according to an embodiment of the present invention.
Figure 2B:
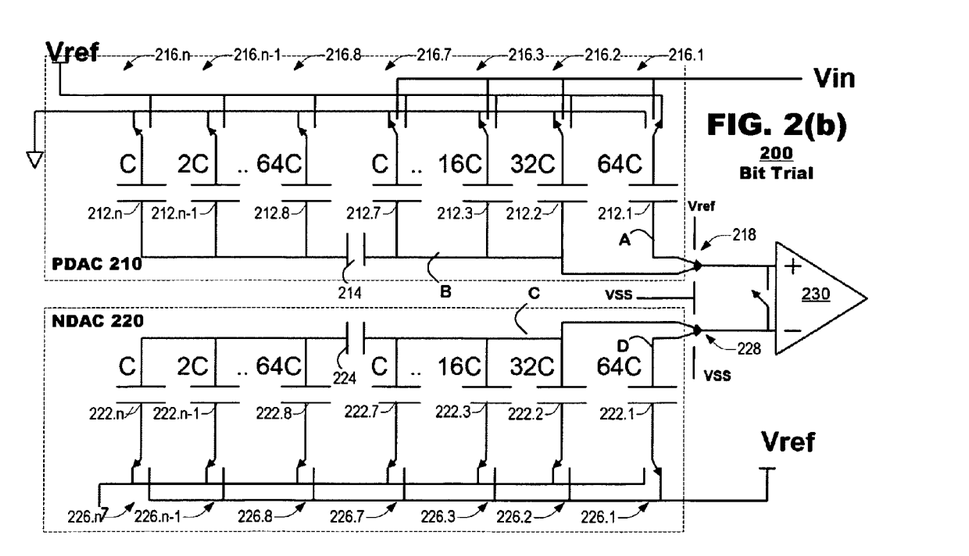

FIGS. 2(a) and 2(b) illustrate a SAR ADC 200 according to an embodiment of the present invention. In this embodiment, the ADC 200 may include a PDAC 210 and an NDAC 220 respectively coupled to positive and negative inputs of a differential comparator 230. The PDAC 210 may include an array of binary weighted capacitors 212.1-212.n and, optionally, a coupling capacitor 214. When a coupling capacitor 214 is used, the coupling capacitor 214 divides the PDAC 210 into two spans—a main DAC span 214.1 and a sub DAC span 214.2. Bottom plates of each capacitor 212.1-212.n are coupled to switches 216.1-216.n which can be selectively controlled to couple the bottom plates respectively to $V_{IN}$, $V_{REF}$ or ground by a control signal (not shown). Top plates of all capacitors 212.1-212.7 of the main DAC span 214.1 and the coupling capacitor 214 may be coupled to switches (shown collectively as 218), which permit the capacitors to be selectively coupled to $V_{REF}$, $V_{SS}$ and the positive terminal of the differential comparator 230. Bottom plates of the remaining capacitors 212.8-212.n may be coupled to the coupling capacitor 214.

The embodiment shown in FIG. 2(a) is appropriate for use in a 14 bit ADC. Each capacitor 212.1-212.n corresponds to a predetermined bit position of a multi-bit output. Capacitor 212.1 corresponds to a most significant bit (MSB) of the digital code to be obtained by the SAR ADC 200. Capacitor 212.2 corresponds to a second MSB of the digital code. Capacitor 212.n corresponds to a least significant bit (LSB) of the digital code. Capacitance values of the capacitors 212.1-212.n are weighted in correspondence with the respective capacitor's bit position within the digital code. In an embodiment that omits the coupling capacitor 214, capacitance values may range from a base capacitance value C to a maximum capacitance value $2^{N-1}*C$, where N represents the length of the digital code to be obtained by the ADC 200 (14 bits in the example of FIG. 2(a)). When a coupling capacitor 214 is used, the coupling capacitor 214 divides the PDAC 210 into spans 214.1 and 214.2. Capacitance values in each span 214.1, 214.2 may range from a base capacitance value C to a maximum capacitance value of $2^{K-1}*C$, where K; represents a count of capacitors in each of the respective spans. The coupling capacitor 214 may have a capacitance of C.

The NDAC 220 may include an array of binary weighted capacitors 222.1-222.n and, optionally, a coupling capacitor 224. Bottom plates of each capacitor 222.1-222.n are coupled to switches 226.1-226.n which can be selectively controlled to couple the bottom plates respectively to $V_{REF}$ or ground by a control signal (not shown). Top plates of all capacitors 222.1-222.7 of a main DAC span 224.1 and the coupling capacitor 214 may be coupled to switches (shown collectively as 228), which permit the capacitors to be selectively coupled to $V_{SS}$ and the negative terminal of the differential comparator 230. Bottom plates of the remaining capacitors 222.8-222.n may be coupled to the coupling capacitor 224. Capacitance values of the NDAC capacitors 222.1-222.n, 224 match capacitance values of the corresponding capacitors from the PDAC 210.

FIG. 2(a) illustrates a switching configuration of the SAR ADC 200 during a sampling phase according to an embodiment of the present invention. Within the PDAC 210, bottom plates of all capacitors within the main DAC span 214.1 are connected to the input voltage $V_{IN}$. The top plate of the MSB capacitor 212.1 may be connected to $V_{REF}$. Top plates of all other capacitors in the main DAC span 214.1 may be connected to $V_{SS}$. Top plates of the capacitors 212.8-212.n in the sub DAC span 214.2 and the coupling capacitor 214 may be connected to ground or $V_{SS}$, although they need not be connected to any voltage. Within the NDAC, all capacitors 221.1-221.n and 224 are connected to $V_{SS}$. The switch configurations generate four independent nodes, labeled A-D in FIG. 2(a), which carry charges as follows:

TABLE 3

| NODE | CHARGE |
| --- | --- |
| A | $Q_A = (V_{REF} - V_{IN}) * 64C$ |
| B | $Q_B = -V_{IN} * (64 + k) * C$ |
| C | $Q_C = 0$ |
| D | $Q_D = 0$ | where k represents an aggregate capacitance of the coupling capacitor 214 and the capacitors 212.8-212.n of the sub DAC span 214.2 of the PDAC 210 (or, equivalently, those capacitors of the NDAC).

FIG. 2(b) illustrates a switching configuration of the SAR ADC 200 during a bit trial phase when the MSB position is subject to test, according to an embodiment of the present invention. Within the PDAC 210, switches 218 connect nodes A and B to the positive input terminal of the differential comparator 230. Switch 216.1 connects the bottom plate of the MSB capacitor 212.1 to a $V_{REF}$ input and the switches 216.2-216.$n$ may connect the bottom plates of the remaining capacitors 212.2-212.$n$ to ground. Within the NDAC 220, switches 228 may connect nodes C and D both to the negative input terminal of the differential comparator 230. Switches 226.1-226.$n$ connect the MSB capacitor 212.1 to $V_{REF}$ and all other NDAC capacitors 212.2-212.$n$ to ground. The switch configurations generate charges at the input terminals of the differential comparator 230 as follows:

TABLE 4

| NODE | CHARGE |
|---|---|
| Positive Input Terminal | $(V_{POS} - V_{REF}) * 64C + (V_{POS})(64 + k) * C = V_{POS}$ $(128 + k) * C - V_{REF} * 64C$ |
| Negative Input Terminal | $(V_{NEG} - V_{REF}) * 64C - V_{NEG}(64 + k) * C = V_{NEG}$ $(128 + K) * C - V_{REF} * 64C$ |

The $V_{REF}$ terms in Table 4 can include time varying noise components which are shown as $V_{REF}(t)$ in subsequent discussion.

Because the charges at the comparator's input terminals are the same as the summation of charges respectively on the node pairs A|B and C|D, the voltages at the positive and negative input terminals ($V_{POS}$ & $V_{NEG}$) can be computed as follows:

$$V_{POS} = \frac{128}{128+k}\left[\frac{V_{REF}}{2} + \frac{V_{REF}(t)}{2} + -V_{in}\right] \quad 1)$$

$$V_{NEG} = \frac{128}{128+k}\left[\frac{V_{REF}(t)}{2}\right] \quad 2)$$

Both equations have time varying $V_{REF}(t)$ terms that cancel each other at the comparator due to common mode rejection, (e.g., $V_{REF}(t)/2 = V_{REF}/2 + n(t)2$, where n(t) is the total time varying noise present on $V_{REF}$ during bit trials.) The n(t) terms cancel out due to common mode rejection. In equation 1) above, a second $V_{REF}$ term represents a $V_{REF}$ value that is obtained during the sampling phase, which is time invariant because it is sampled on to the cap array as a charge. Therefore, the embodiment of FIGS. 2(a) and 2(b) provides protection against any time varying noise component that may be present on the $V_{REF}$ source.

Due to common mode rejection at the differential comparator 230, equations 1) and 2) above resolve to a comparison between the input voltage $V_{IN}$ and ½ $V_{REF}$. The differential comparator 230 may generate an output indicating whether $V_{IN}$>½ $V_{REF}$ and, if so, a controller (not shown) determines that the MSB is a '1;' otherwise, it may determine that the MSB is a '0.' Thereafter, the controller establishes switch settings to test the next bit position. If the MSB is determined to be a '1,' switch 216.1 corresponding to the MSB capacitor 212.1 is maintained connected to $V_{REF}$. Otherwise, it is connected to ground. The NDAC switches remain unchanged. Switch 216.2 connects the bottom plate of capacitor 212.2 to $V_{REF}$ and the next bit is tested. The controller advances across all bit positions in sequence from MSB to LSB in this fashion—to set switches 216.1-216.$n$ of the already tested bit positions according to the determined code and to test the next bit position in order—until the entire digital code corresponding to $V_{IN}$ is detected. Thereafter, the bit trial phase may cease.

Figure 3A:
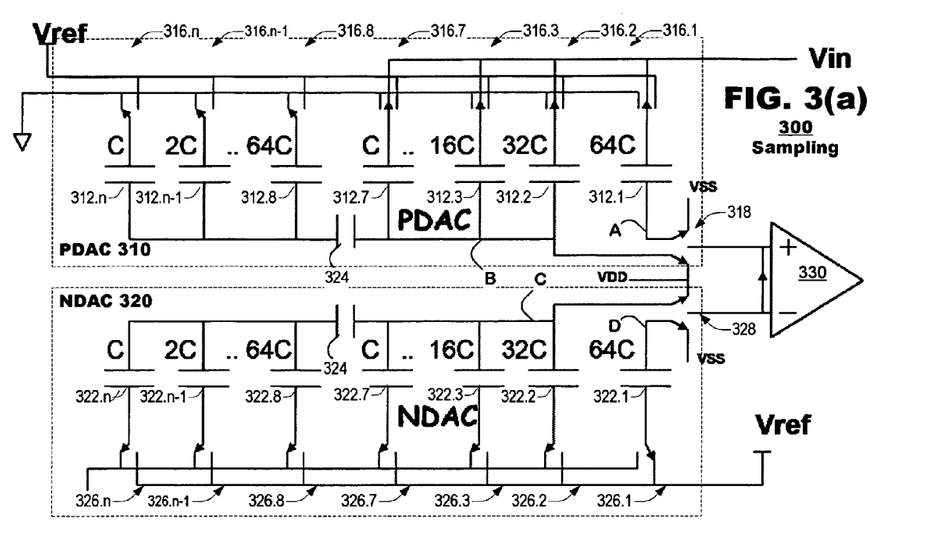
FIGS. 3(a) and 3(b) illustrate an SAR ADC according to another embodiment of the present invention.
Figure 3B:
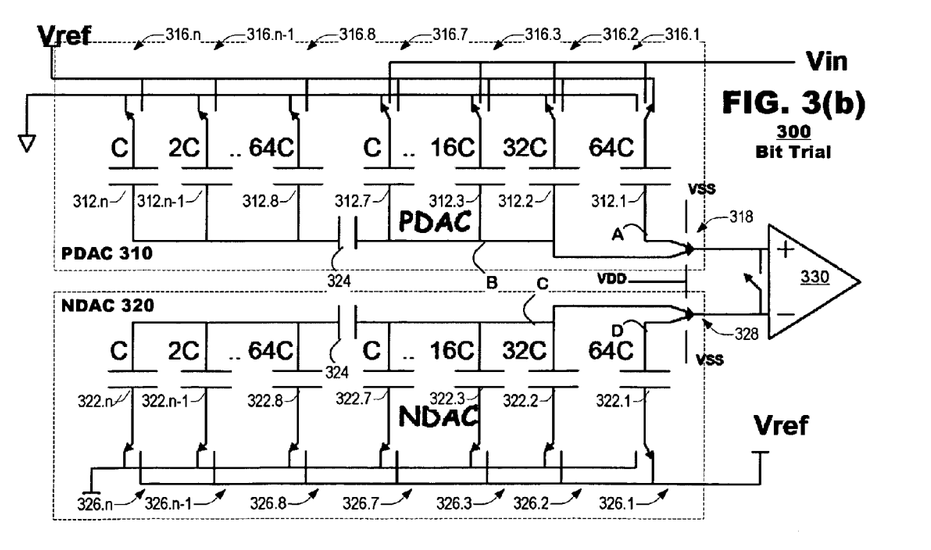

FIGS. 3(a) and 3(b) illustrate an SAR ADC 300 according to another embodiment of the present invention. In this embodiment, the ADC 300 may include a PDAC 310 and an NDAC 320 respectively coupled to positive and negative inputs of a differential comparator 330. The PDAC 310 may include an array of binary weighted capacitors 312.1-312.$n$ and, optionally, a coupling capacitor 314. When a coupling capacitor 314 is used, the coupling capacitor 314 divides the PDAC 310 into two spans—the main DAC span 314.2 and the sub DAC span 314.2. Bottom plates of each capacitor 312.1-312.$n$ are coupled to switches 316.1-316.$n$ which can be selectively controlled to couple the bottom plates respectively to $V_{IN}$, $V_{REF}$ or ground by a control signal (not shown). Top plates of all capacitors 312.1-312.7 in the main DAC span 314.1 and the coupling capacitor 314 itself may be coupled to switches (shown collectively as 318), which permit the capacitors to be selectively coupled to $V_{REF}$, $V_{SS}$ and the positive terminal of the differential comparator 330. Bottom plates of the remaining capacitors 312.8-312.$n$ may be coupled to the coupling capacitor 314.

The embodiment shown in FIG. 3(a) is appropriate for use in a 14 bit ADC. Each capacitor 312.1-312.$n$ corresponds to a predetermined bit position of a multi-bit output. Capacitor 312.1 corresponds to a most significant bit (MSB) of the digital code to be obtained by the SAR ADC 300. Capacitor 312.2 corresponds to a second MSB of the digital code. Capacitor 312.$n$ corresponds to a least significant bit (LSB) of the digital code. Capacitance values of the capacitors 312.1-312.$n$ are weighted in correspondence with the respective capacitor's bit position within the digital code. In an embodiment that omits the coupling capacitor 314, capacitance values may range from a base capacitance value C to a maximum capacitance value $2^{N-1}*C$, where N represents the length of the digital code to be obtained by the ADC 300 (14 bits in the example of FIG. 3(a)). When a coupling capacitor 314 is used, the coupling capacitor 314 divides the PDAC 310 into the two spans 314.1 and 314.2. Capacitance values in each span 314.1, 314.2 may range from a base capacitance value C to a maximum capacitance value of $2^{K-1}*C$, where K represents a count of capacitors in each of the respective spans.

The NDAC 320 may include an array of binary weighted capacitors 322.1-322.$n$ and, optionally, a coupling capacitor 324. Bottom plates of each capacitor 322.1-322.$n$ are coupled to switches 326.1-326.$n$ which can be selectively controlled to couple the bottom plates respectively to $V_{REF}$ or ground by a control signal (not shown). Top plates of all capacitors 322.1-322.7 in a main DAC span 324.1 and the coupling capacitor 324 may be coupled to switches (shown collectively as 328), which permit the capacitors to be selectively coupled to $V_{SS}$ and the negative terminal of the differential comparator 330. Bottom plates of the remaining capacitors 322.8-322.$n$ may be coupled to the coupling capacitor 324. Capacitance values of the NDAC capacitors 322.1-322.$n$, 324 match capacitance values of the corresponding capacitors from the PDAC 310.

FIG. 3(a) illustrates a switching configuration of the SAR ADC 300 during a sampling phase according to an embodiment of the present invention. Within the PDAC 310, bottom plates of all capacitors within the main DAC span 314.1 are connected to the input voltage $V_{IN}$. The top plate of the MSB capacitor 312.1 may be connected to $V_{SS}$. Top plates of all other capacitors in the main DAC span 314.1 may be connected to $V_{DD}$. The coupling capacitor 314 also may be connected to $V_{DD}$. Bottom plates of the capacitors 312.8-312.$n$ in the sub DAC span 314.2 may be connected to ground, although they need not be connected to any voltage. Within the NDAC, top plates of all capacitors 322.1-322.7 and capacitor 324 may be connected to $V_{DD}$. A bottom plate of the MSB capacitor 322.1 of the NDAC 320 may be connected to $V_{REF}$. Bottom plates of the remaining NDAC capacitors 322.2-322.$n$ may be connected to ground. The switch configurations generate charges on the four independent nodes A-D as follows:

TABLE 5

| NODE | CHARGE |
|---|---|
| A | $Q_A = -V_{IN} * 64C$ |
| B | $Q_B = (V_{DD} - V_{IN}) * (64 + k) * C$ |
| C | $Q_C = -V_{REF} * 64C$ |
| D | $Q_D = V_{DD} * (64 + k) * C$ | where k represents an aggregate capacitance of the coupling capacitor 314 and the capacitors 312.8-312.$n$ of the sub DAC span 314.2 of the PDAC 310 (or, equivalently, those capacitors of the NDAC 320).

FIG. 3(b) illustrates a switching configuration of the SAR ADC 300 during a bit trial phase when the MSB position is subject to test, according to an embodiment of the present invention. Within the PDAC 310, switches 318 connect nodes A and B both to the positive input terminal of the differential comparator 330. Switch 316.1 connects the bottom plate of the MSB capacitor 312.1 to a $V_{REF}$ input and the switches 316.2-316.$n$ may connect the bottom plates of the remaining capacitors 312.2-312.$n$ to ground. Within the NDAC 320, switches 328 may connect nodes C and D both to the negative input terminal of the differential comparator 330. Switch 326.1 may connect the bottom plate of capacitor 321.1 to $V_{REF}$ and the remaining switches 326.2-326.$n$ may connect the bottom plates of their respective capacitors 321.2-321.$n$ to ground. The switch configurations generate charges at the input terminals of the differential comparator 330 as follows:

TABLE 6

| NODE | CHARGE |
|---|---|
| Positive Input Terminal | $(V_{POS} - V_{REF}) * 64C + (V_{POS})(64 + k) * C = V_{POS}(128 + k) * C - V_{REF} * 64C$ |
| Negative Input Terminal | $(V_{NEG} - V_{REF}) * 64C - V_{NEG}(64 + k) * C = V_{NEG}(128 + K) * C - V_{REF} * 64C$ |

The $V_{REF}$ terms in Table 6 can include time varying noise components, which are shown as $V_{REF}(t)$ in subsequent discussion.

Because the charges at the comparator's input terminals are the same as the summation of charges respectively on the node pairs A|B and C|D, the voltages at the positive and negative input terminals ($V_{POS}$ & $V_{NEG}$) can be computed as follows:

$$V_{POS} = \frac{128}{128+k}\left[\frac{V_{DD}(64+k)}{128} + \frac{V_{REF}(t)}{2} + -V_{in}\right] \quad 3)$$

$$V_{NEG} = \frac{128}{128+k}\left[\frac{V_{DD}(64+k)}{128} + n(t)\right] \quad 4)$$

where n(t) represents a time varying noise differential that may exist between a $V_{REF}$ value that exists during the sampling phase and a $V_{REF}$ value that exists during bit trial. This noise term may cancel with a noise contribution in equation 3) above as would the $$\frac{V_{DD}(64+k)}{128}$$

terms in both equations.

Due to common mode rejection at the differential comparator 330, equations 3) and 4) above resolve essentially to a comparison between the input voltage $V_{IN}$ and $½ V_{REF}$. The differential comparator 330 may generate an output indicating whether $V_{IN} > ½ V_{REF}$ and, if so, a controller (not shown) determines that the MSB is a '1,' otherwise, it may determine that the MSB is a '0.' Thereafter, the controller establishes switch settings to test the next bit position. If the MSB is determined to be a '1,' switch 316.1 corresponding to the MSB capacitor 312.1 is maintained connected to $V_{REF}$. Otherwise, it is connected to ground. The NDAC switches remain unchanged. The controller advances across all bit positions in sequence from MSB to LSB in this fashion—to set switches 316.1-316.$n$ of the already tested bit positions according to the determined code and to test the next bit position in order—until the entire digital code corresponding to $V_{IN}$ is detected. Thereafter, the bit trial phase may cease.

Although the embodiments of FIGS. 2(a)-(b) and 3(a)-(b) illustrate a 14 bit ADC, the principles of the present invention are not so limited. The principles of the present invention may extend to an SAR ADC of arbitrary bit length n. (an n-bit ADC). In such embodiments, the PDACs and NDACs may include respective arrays of binary weighted capacitors having capacitance values C to $2^{n-1}$C. If a coupling capacitor is used, the capacitance values may be C to $2^{P-1}*$C for p capacitors of the sub DAC and C to $2^{q-1}*$C for q capacitors of the main DAC (n=p+q).

The embodiments of FIGS. 2(a)-(b) and FIGS. 3(a)-(b) may be termed a split plate design because switches 218, 228 and 318, 328 generate a pair of nodes in the main DAC spans of the PDAC and NDAC. In another embodiment, the split plate design may be omitted in favor of a common plate design in which a common mode voltage generator such as that shown in published U.S. application 2004/0075601 (see discussion of voltage CM).

Figure 4:
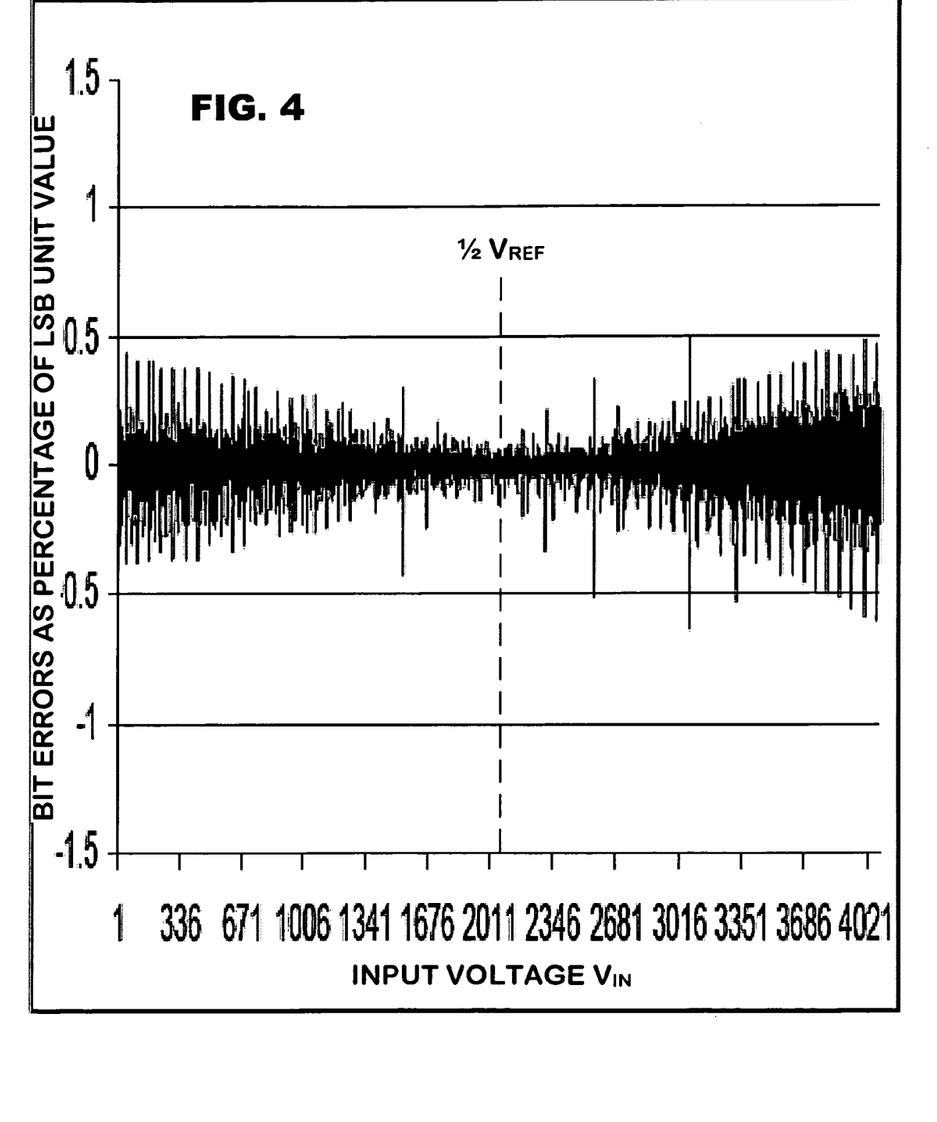
FIG. 4 illustrates error distribution of an SAR ADC according to an embodiment of the present invention.

FIG. 4 is a graph illustrating a distribution of bit errors obtained by SAR ADCs of the embodiments of FIGS. 2(a), 2(b) as compared to $V_{IN}$. As illustrated therein, the SAR ADCs constrain bit errors to within ±½ of the magnitude of the LSB of an output code. As compared to prior SAR ADC designs, where bit errors could be ±1 LSB, this represents a 50% improvement in accuracy.

As shown in FIG. 4, the bit error distribution has a local minimum centered around a $V_{IN}$ value corresponding to $½V_{REF}$ and local maxima at digital codes corresponding to $V_{IN}=0$ and $V_{DD}$. According to other embodiments of the present invention, the bit error distributions may be tuned to accommodate other error profiles, which can further improve performance. In such embodiments, during the sampling phase, switches of select NDAC capacitors may be tuned to an expected value of $V_{IN}$. For example, the range of permissible $V_{IN}$ values may be divided into a predetermined number of bands (say, 4 bands) and a controller of the ADC may receive data representing a coarse estimate of a band in which $V_{IN}$ is likely to fall. Select NDAC capacitors may be connected to $V_{REF}$ according to the identified band.

In one embodiment, referring to the ADC of FIG. 2(a), for example, capacitors of the NDAC may be connected to $V_{REF}$ as follows:

TABLE 7

| EXPECTED VOLTAGE BAND OF $V_{IN}$ | SELECTED CAPACITORS |
|---|---|
| 0 to ¼ $V_{REF}$ | No capacitors connected to $V_{REF}$. |
| ¼ $V_{REF}$ to ½ $V_{REF}$ | The 32C capacitor 222.2 may be connected to $V_{REF}$. |
| ½ $V_{REF}$ to ¾ $V_{REF}$ | The 64C capacitor 222.1 may be connected to $V_{REF}$. |
| ¾ $V_{REF}$ to $V_{REF}$ | The 64C and 32C capacitors 222.1, 222.2 may be connected to $V_{REF}$. |

In the embodiment presented in Table 7, the input range $0$-$V_{REF}$ is divided into four bands having boundaries a ¼$V_{REF}$, ½$V_{REF}$ and ¾$V_{REF}$. The capacitor selections shown in Table 7 generate error distributions that generally have a local minimum at the lower end of each band and a local maximum at the higher end of the respective band.

Alternatively, again referring to the ADC of FIG. 2(a), capacitor of the NDAC may be connected to $V_{REF}$ as follows:

TABLE 8

| EXPECTED VOLTAGE BAND OF $V_{IN}$ | SELECTED CAPACITORS |
|---|---|
| 0 to ¼ $V_{REF}$ | The 32C capacitor 222.2 may be connected to $V_{REF}$ |
| ¼ $V_{REF}$ TO ½ $V_{REF}$ | The 64C capacitor 222.1 may be connected to $V_{REF}$. |
| ½ $V_{REF}$ TO ¾ $V_{REF}$ | The 64C and 32C capacitors 222.1, 222.2 may be connected to $V_{REF}$. |
| ¾ $V_{REF}$ TO $V_{REF}$ | All capacitors 222.1-222.7 upstream of the coupling capacitor 224 may be connected to $V_{REF}$. |

In the embodiment presented in Table 8, the input range $0$-$V_{REF}$ also is divided into four bands having boundaries a ¼$V_{REF}$, ½$V_{REF}$ and ¾$V_{REF}$. The capacitor selections shown in Table 8, however, generate error distributions that generally have a local maximum at the lower end of each band and a local minimum at the higher end of the respective band.

The embodiments of Table 7 and Table 8 provide increase immunity to noise, for example, to 25% of the noise that arises due to operation of the ADC of FIGS. 1(a) and 1(b).

In a further embodiment of the present invention, the shape of the error distribution—whether it increases or decreases from the lower end to the higher end of each band—may be tailored on a band-by-band basis. Table 9 illustrates several distribution profiles that may be selected for an ADC that divides the input range into four bands, showing capacitor selections that may cause generally increasing or decreasing error profiles within the respective four bands.

TABLE 9

| PAT'N NO. | DESIRED ERROR DISTRIBUTION PROFILE | | | | FRACTION OF CAPACITANCE SELECTED BASED ON $V_{IN}$ ESTIMATE | | | |
|---|---|---|---|---|---|---|---|---|
| | BAND 1 | BAND 2 | BAND 3 | BAND 4 | BAND 1 | BAND 2 | BAND 3 | BAND 4 |
| 1 | Increase | Increase | Increase | Increase | 0 | ¼ | ½ | ¾ |
| 2 | Increase | Increase | Increase | Decrease | 0 | ¼ | ½ | 1 |
| 3 | Increase | Increase | Decrease | Increase | 0 | ¼ | ¾ | ¾ |
| 4 | Increase | Increase | Decrease | Decrease | 0 | ¼ | ¾ | 1 |
| 5 | Increase | Decrease | Increase | Increase | 0 | ½ | ½ | ¾ |
| 6 | Increase | Decrease | Increase | Decrease | 0 | ½ | ½ | 1 |
| 7 | Increase | Decrease | Decrease | Increase | 0 | ½ | ¾ | ¾ |
| 8 | Increase | Decrease | Decrease | Decrease | 0 | ½ | ¾ | 1 |
| 9 | Decrease | Increase | Increase | Increase | ¼ | ¼ | ½ | ¾ |
| 10 | Decrease | Increase | Increase | Decrease | ¼ | ¼ | ½ | 1 |
| 11 | Decrease | Increase | Decrease | Increase | ¼ | ¼ | ¾ | ¾ |
| 12 | Decrease | Increase | Decrease | Decrease | ¼ | ¼ | ¾ | 1 |
| 13 | Decrease | Decrease | Increase | Increase | ¼ | ½ | ½ | ¾ |
| 14 | Decrease | Decrease | Increase | Decrease | ¼ | ½ | ½ | 1 |
| 15 | Decrease | Decrease | Decrease | Increase | ¼ | ½ | ¾ | ¾ |
| 16 | Decrease | Decrease | Decrease | Decrease | ¼ | ½ | ¾ | 1 |

Table 9 also identifies capacitance levels that may be switched to $V_{REF}$ during a sampling phase to achieve the desired profile. Using pattern no. 1 as an example, to achieve an error distribution profile that is increasing from 0 to $V_{REF}$ and based on a coarse estimate of $V_{IN}$, none of the NDAC capacitors are connected to $V_{REF}$ if $V_{IN}$ is estimated to occur in the first band ($V_{IN}$<¼$V_{REF}$), ¼ of the total NDAC capacitance is connected to $V_{REF}$ if $V_{IN}$ is estimated to occur in the second band (¼$V_{REF}$<$V_{IN}$<½$V_{REF}$), ½ of the total NDAC capacitance is connected to $V_{REF}$ if $V_{IN}$ is estimated to occur in the third band (½$V_{REF}$<$V_{IN}$<¾$V_{REF}$) and ¾ of the total NDAC capacitance is connected to $V_{REF}$ if $V_{IN}$ is estimated to occur in the fourth band (¾$V_{REF}$<$V_{IN}$). By contrast, if pattern 4 is selected, which provides a generally increasing error profile over bands 1 and 2 and a generally decreasing error profile over bands 3 and 4, none of the NDAC capacitors are connected to $V_{REF}$ if $V_{IN}$ is estimated to occur in the first band ($V_{IN}$<¼$V_{REF}$), ¼ of the total NDAC capacitance is connected to $V_{REF}$ if $V_{IN}$ is estimated to occur in the second band (¼$V_{REF}$<$V_{IN}$<½$V_{REF}$), ¾ of the total NDAC capacitance is connected to $V_{REF}$ if $V_{IN}$ is estimated to occur in the third band (½$V_{REF}$<$V_{IN}$<¾$V_{REF}$) and all of the total NDAC capacitance is connected to $V_{REF}$ if $V_{IN}$ is estimated to occur in the fourth band ($\frac{3}{4}V_{REF} < V_{IN}$). Different error distribution profiles may be selected as desired to tailor the profiles for specific applications.

As noted earlier, the MSB capacitor 222.1 (FIG. 2(*a*)) of a SAR ADC represents ½ of the capacitance of the NDAC 210. The capacitor 222.2 of the next bit position represents ¼ of the total capacitance of the NDAC 210. For example, the SAR ADC 200 of FIG. 2(*a*) is illustrated as a 14 bit ADC, in which the total NDAC capacitance is 128C. Capacitors 222.1 and 222.2 have capacitance values of 64C and 32C respectively. Therefore, to select capacitances as shown in Table 9, it is sufficient to select one or both of the two capacitors 222.1, 222.2 to $V_{REF}$ as determined in Table 9. Of course, the principles of the present invention find application in systems that divide the input range into more or fewer than four bands.

Figure 5:
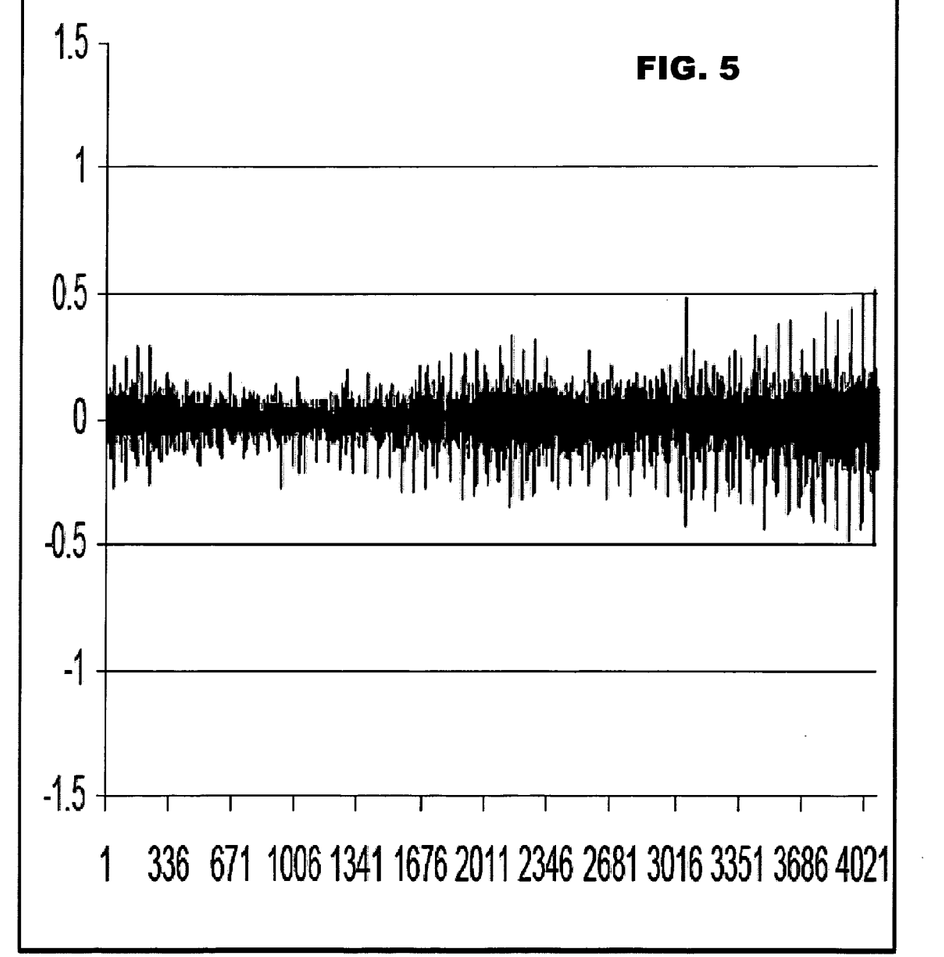
FIG. 5 illustrates error distribution of an SAR ADC according to another embodiment of the present invention.

In a further embodiment, an SAR ADC may select two distribution profiles from Table 9, having complementary shapes on each band and apply them randomly to input test voltages. For example, profiles 1 and 16 complement each other. Doing so contributes to generally uniform error distributions on a statistical basis, without local minima or maxima to the distribution profile. FIG. 5 illustrates a distribution graph that may be generated from randomization of profiles. The embodiment of Table 9 can provide increase immunity to noise, for example, to 12.5% of the noise that arises due to operation of the ADC of FIGS. 1(*a*) and 1(*b*).

Figure 6:
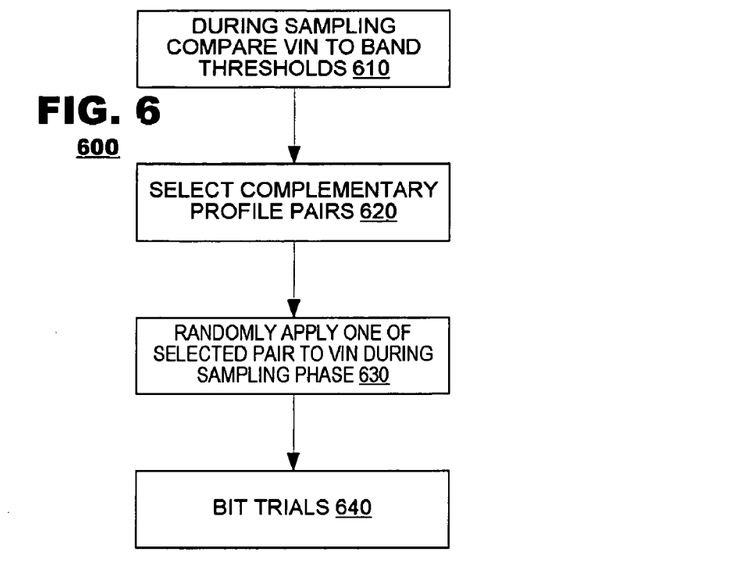
FIG. 6 illustrates a method according to an embodiment of the present invention.

FIG. 6 illustrates a flow chart of a method according to an embodiment of the present invention. When a new test input voltage $V_{IN}$ becomes available, the method may compare the input voltage to threshold voltages that differentiate among the bands (box 610). Thereafter, the method may select a pair of complementary profiles for use during conversion (box 620). During sampling, a random one of the select profiles is applied to the SAR ADC during sampling (box 630). Thereafter, the method advances to the bit trial phase (box 640).

Figure 7:
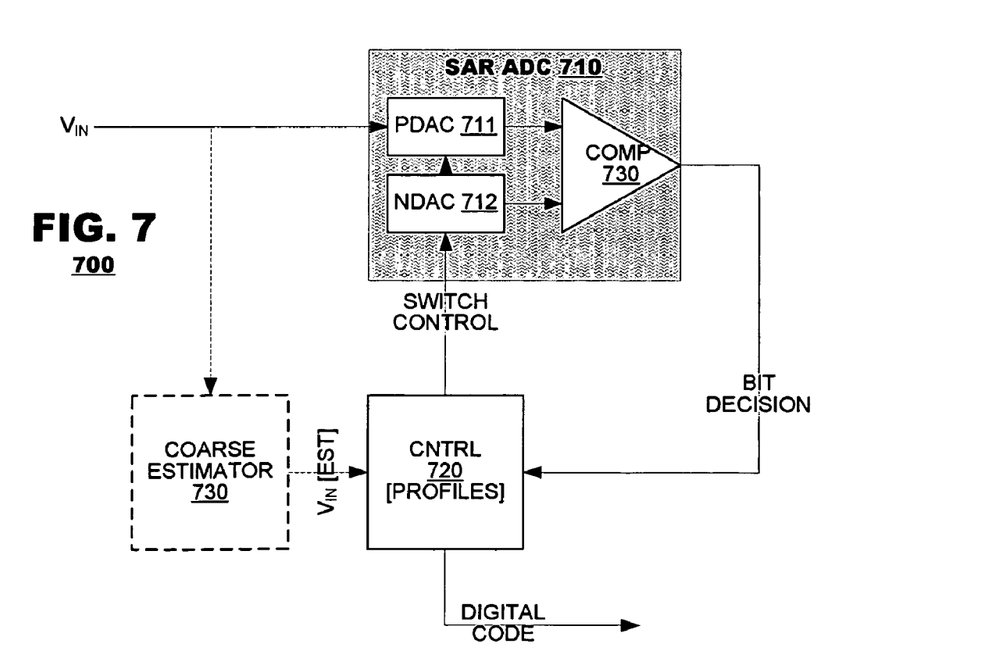
FIG. 7 illustrates an ADC system according to an embodiment of the present invention.

FIG. 7 illustrates an ADC system 700 according to an embodiment of the present invention. As illustrated, the system 700 may include an SAR ADC 710 and a controller 720. The SAR ADC 710 may include a PDAC 711, NDAC 712 and differential comparator 730 of any of the foregoing embodiments. The PDAC 711 is connected to an input test voltage $V_{IN}$ from an input source. PDAC and NDAC connections to $V_{REF}$, $V_{DD}$, $V_{SS}$ and ground are omitted from the illustration of FIG. 7 for the sake of clarity. The controller 720 may be a state machine that controls the ADC 710 during both the sampling phase and bit trials. Often in implementation, the system 700 will be manufactured as part of a common integrated circuit on a common semiconductor substrate.

During the sampling and bit trial phases, switches of the PDAC and NDAC (not shown) operate as controlled by switch control signals generated by the controller 720. During the bit trial phase, each bit position is tested in sequence. The comparator 713 outputs a bit decision signal, which is interpreted by the controller 720. The controller 720 may set switch connections of subsequent bit trials in response to bit decisions of previously tested bits output by the differential comparator 730. At the conclusion of the bit trials, the controller 720 may output a multi-bit code representing the digital value of the input test voltage $V_{IN}$.

In another embodiment, the system may include a coarse voltage estimator 730. The estimator 730, in response to the input signal, generates a signal representing an estimate of the input voltage $V_{IN}$. Typically, the estimate signal is a multi-bit signal identifying one of several voltage bands in which the input signal is likely to reside. In such an embodiment, the controller 720 also may be programmed with data representing error profiles available for use. The controller 720 may select one of the profiles to set switch configurations for the ADC 710 during the sampling phase. Thereafter, bit trials may commence and the digital value of $V_{IN}$ will be determined.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A successive approximation register analog to digital converter (SAR ADC), comprising:
   a differential comparator,
   a pair of binary weighted capacitor arrays, the capacitor arrays having switch controls coupled thereto that configure each capacitor array for a sampling phase and a bit trial phase,
   wherein, during the bit trial phase:
      the switch control connects select capacitors of each capacitor array to a reference potential, and
      the differential comparator rejects as a common mode signal time varying noise elements of the reference potential that are obtained during the bit trial phase.

2. The SAR ADC of claim 1, wherein the reference potential is VDD.

3. The SAR ADC of claim 1, wherein the reference potential is at a value intermediate between VDD and ground.

4. The SAR ADC of claim 1, wherein, during the bit trial phase,
   for a first capacitor array:
      top plates of a plurality of capacitors in a first common span are connected to a first input of the differential comparator by switch control,
      bottom plates of the capacitors are connected to either the reference potential or ground based on a capacitor currently subject to test and on any decisions made regarding other previously-tested capacitors; and
   for a second capacitor array:
      top plates of a plurality of capacitors in a second common span are connected to a second in put of the differential comparator by switch control, and
      bottom plates of the capacitors are selectively connected to the reference potential.

5. The SAR ADC of claim 4, wherein, during the sampling phase:
   for the first capacitor array:
      top plates of the capacitors in the first common span are respectively connected to either the reference potential or ground by switch control,
      bottom plates of the capacitors in the first common span are connected to an input test voltage; and
   for the second capacitor array, top plates and bottom plates of the capacitors in the second common span are connected to ground.

6. The SAR ADC of claim 4, wherein, during the sampling phase:
   for the first capacitor array, the switch control selectively connects:
      top plates of each of the capacitors to one of a first pair of intermediate nodes, one node of the first pair being connected to ground and a second node of the first pair being connected to a second potential greater than the reference potential,
      bottom plates of the capacitors in the first common span to an input test voltage; and for the second capacitor array, the switch control selectively connects:
top plates of each of the capacitors to one of a second pair of intermediate nodes, one node of the second pair being connected to ground and a second node of the second pair being connected to the second potential,
bottom plates of select capacitors in the second common span to reference potential, bottom plates of other capacitors in the second common span to or ground.

7. The SAR ADC of claim 4, wherein, during the sampling phase, switch control selects capacitors of the second capacitor array to be connected to the reference potential based on a shape of error distribution associated therewith.

8. The SAR ADC of claim 4, wherein, during the sampling phase, switch control selects capacitors of the second capacitor array to be connected to the reference potential based on a coarse estimation of an analog input voltage to be converted to digital.

9. A successive approximation register analog to digital converter (SAR ADC), comprising:
a differential comparator,
a pair of binary weighted capacitor arrays, the capacitor arrays having a capacitor for each bit position of a digital code to be output of the SAR ADC and switch controls coupled thereto that configure each capacitor array for a sampling phase and a bit trial phase, wherein
in the sampling phase, the switch controls configure a first one of the binary weighted capacitor array to sample a test voltage and a reference voltage, and
in the bit trial phase:
the switch control connects select capacitors of each capacitor array to a reference potential, and
the differential comparator rejects as a common mode signal time-varying noise elements of the reference potential that are obtained during the bit trial phase.

10. The SAR ADC of claim 9, wherein the reference potential is VDD.

11. The SAR ADC of claim 9, wherein the reference potential is at a value intermediate between VDD and ground.

12. The SAR ADC of claim 9, wherein, during the bit trial phase,
for a first capacitor array:
top plates of a plurality of capacitors in a first common span are connected to a first input of the differential comparator by switch control,
bottom plates of the capacitors are connected to either the reference potential or ground based on a capacitor currently subject to test and on any decisions made regarding other previously-tested capacitors; and
for a second capacitor array:
top plates of a plurality of capacitors in a second common span are connected to a second input of the differential comparator by switch control, and
bottom plates of the capacitors are selectively connected to the reference potential.

13. The SAR ADC of claim 12, wherein, during the sampling phase:
for the first capacitor array:
top plates of the capacitors in the first common span are respectively connected to either the reference potential or ground by switch control,
bottom plates of the capacitors in the first common span are connected to an input test voltage; and
for the second capacitor array, top plates and bottom plates of the capacitors in the second common span are connected to ground.

14. The SAR ADC of claim 12, wherein, during the sampling phase:
for the first capacitor array, the switch control selectively connects:
top plates of each of the capacitors to one of a first pair of intermediate nodes, one node of the first pair being connected to ground and a second node of the first pair being connected to a second potential greater than the reference potential,
bottom plates of the capacitors in the first common span to an input test voltage; and
for the second capacitor array, the switch control selectively connects:
top plates of each of the capacitors to one of a second pair of intermediate nodes, one node of the second pair being connected to ground and a second node of the second pair being connected to the second potential,
bottom plates of select capacitors in the second common span to reference potential, bottom plates of other capacitors in the second common span to or ground.

15. The SAR ADC of claim 12, wherein, during the sampling phase, switch control selects capacitors of the second capacitor array to be connected to the reference potential based on a shape of error distribution associated therewith.

16. The SAR ADC of claim 12, wherein, during the sampling phase, switch control selects capacitors of the second capacitor array to be connected to the reference potential based on a coarse estimation of an analog input voltage to be converted to digital.

17. A control method for a successive approximation register analog to digital converter (SAR ADC), comprising:
sampling a test voltage during a sampling phase of the SAR ADC,
sampling a reference voltage during the sampling phase of the SAR ADC,
during a bit trial phase of the SAR ADC:
switchably connecting respective intermediate nodes of the SAR ADC to respective inputs of a differential comparator,
switchably connecting a capacitor representing a first bit subject to test to the reference potential, causing a scaled voltage change corresponding to the reference potential to be input to a first input of the differential comparator, and
switchably connecting the scaled voltage change corresponding to the reference potential to be input to a second input of the differential comparator,
wherein temporal variations of the reference potential that occur during the bit trial phase are presented to the differential comparator as a common mode signal.

18. A method of controlling an SAR ADC, comprising:
generating a coarse estimate of the input voltage indicating one of a plurality of voltage bands in which the input voltage is likely to reside,
based on the indicated voltage band, retrieving switch data representing a desired error profile for the SAR ADC,
during a sampling phase of the SAR ADC:
selecting elements of a first capacitor array of the SAR ADC to be connected to a reference potential and sampling the reference potential via the selected elements,
sampling an the input voltage via a second capacitor array of the SAR ADC;
during a bit trial phase of the SAR ADC:

coupling accumulated charge of the first and second capacitor arrays to a differential comparator of the SAR ADC;

switching selected capacitors of the second capacitor array in sequence to the reference potential to test the sampled input voltage, and switching selected capacitors of the first capacitor array to the reference potential, wherein time varying contributions of the reference potential are rejected by the differential comparator as a common mode signal for at least one bit trial.

19. The method of claim 18, further comprising:
storing switch data of two complementary error profiles, and
for each iteration of the method of claim 18, selecting at random one of the error profiles for the sampling phase of the respective iteration.

20. The method of claim 18, wherein the selecting comprises selecting an error profile having a local minimum in a band that corresponds to the indicated voltage band.

* * * * *